US012217922B2

United States Patent
Bachorz et al.

(10) Patent No.: US 12,217,922 B2
(45) Date of Patent: Feb. 4, 2025

(54) METHOD FOR MONITORING VACUUM INTERRUPTER'S CONDITION AND AN ELECTRIC SWITCHING DEVICE

(71) Applicant: Hitachi Energy Ltd, Zürich (CH)

(72) Inventors: Lukasz Bachorz, Mount Martha (AU); Timothy John Heemskerk, Mooroolbark (AU)

(73) Assignee: HITACHI ENERGY LTD, Zurich (CH)

( * ) Notice: Subject to any disclaimer, the term of this patent is extended or adjusted under 35 U.S.C. 154(b) by 87 days.

(21) Appl. No.: 17/802,115

(22) PCT Filed: Feb. 24, 2020

(86) PCT No.: PCT/EP2020/054781
§ 371 (c)(1),
(2) Date: Aug. 24, 2022

(87) PCT Pub. No.: WO2021/170208
PCT Pub. Date: Sep. 2, 2021

(65) Prior Publication Data
US 2023/0086911 A1    Mar. 23, 2023

(51) Int. Cl.
*H01H 33/668*    (2006.01)
*G01R 31/327*    (2006.01)

(52) U.S. Cl.
CPC ....... *H01H 33/668* (2013.01); *G01R 31/3275* (2013.01)

(58) Field of Classification Search
None
See application file for complete search history.

(56) References Cited

U.S. PATENT DOCUMENTS

| 5,644,463 A * | 7/1997 | El-Sharkawi | H01H 9/56 361/7 |
| 7,253,630 B1 * | 8/2007 | Zhou | G01R 31/3274 324/424 |

(Continued)

FOREIGN PATENT DOCUMENTS

| CN | 110491721 A | 11/2019 |
| DE | 36 43 672 A1 | 6/1998 |
| GB | 2 203 559 A | 10/1988 |

OTHER PUBLICATIONS

Kam, Shui-cheong; Assessing of Circuit Breaker Restrike Risk Using Computer Simulation and Wavelet Analysis; School of Electrical Engineering and Computer Science; Science and Engineering Faculty; Queensland University of Technology; Queensland, Australia; Jun. 2012; 308 Pages.

(Continued)

*Primary Examiner* — Nasima Monsur
(74) *Attorney, Agent, or Firm* — Procopio, Cory, Hargreaves & Savitch LLP

(57) ABSTRACT

Embodiments relate to a method for monitoring the vacuum interrupter's condition of an electric device. The method comprises receiving a first voltage signal indicating a first voltage at a first contact of a switch inside the electric device. The first contact of the switch is coupled to a source line. The method further comprises receiving a second voltage signal indicating a second voltage at a second contact of the switch. The second contact of the switch is coupled to a reactive component. The method comprises receiving a current signal indicating a current at the second contact of the switch. The method comprises determining occurrence of a restrike in response to determining increasing amplitudes of the first voltage signal, the second voltage signal and the current signal in a time slot. The method (Continued)

further comprises determining the vacuum interrupter condition based on the determined occurrence of the restrike.

14 Claims, 3 Drawing Sheets

(56) References Cited

U.S. PATENT DOCUMENTS

| | | | | |
|---|---|---|---|---|
| 2002/0050484 | A1* | 5/2002 | Rostron | H01H 33/126 |
| | | | | 218/2 |
| 2010/0170774 | A1* | 7/2010 | Einschenk | H01H 33/027 |
| | | | | 200/48 R |
| 2015/0325394 | A1 | 11/2015 | Kovacich et al. | |
| 2017/0294786 | A1* | 10/2017 | Gerovac | H02J 7/0068 |

OTHER PUBLICATIONS

Lopez-Roldan et al; Development of non-intrusive monitoring for reactive switching of high voltage circuit breaker; Electrical Power and Energy Systems 61 (2014) 219-228; 10 Pages.

* cited by examiner

METHOD FOR MONITORING VACUUM INTERRUPTER'S CONDITION AND AN ELECTRIC SWITCHING DEVICE

CROSS-REFERENCE TO RELATED APPLICATIONS

The present application is a national stage entry of International Patent Application No. PCT/EP2020/054781, filed on Feb. 24, 2020, which is hereby incorporated herein by reference as if set forth in full.

TECHNICAL FIELD

Example embodiments of the present disclosure generally relate to a technology of monitoring an electric device and more particularly, to a method for monitoring a vacuum interrupter's condition of the electric device and an electric switching device.

BACKGROUND

In electrical apparatuses, interrupters, such as vacuum interrupters, sulfur hexafluoride ($SF_6$) interrupters, and air interrupters, are widely employed. These interrupters are employed based on different applications. Vacuum interrupters have unique merits, such as compact dimensions, small contact travel, maintenance free operation and a long lifetime. Due to these merits, the vacuum interrupters become widely used in medium voltage distribution networks.

The superb dielectric and arc quenching capabilities of the vacuum interrupters rely on a high vacuum environment, usually between $10^{-5}$ to $10^{-9}$ Torr (1 Torr=1.3 mBar). Based on the Paschen law; the dielectric strength of a gas is a function of the gas pressure (P), the distance (d) between the two electrodes or contacts and the type of gas. It is assumed that the critical pressure level for maximum dielectric performance is $10^{-3}$ mBar. However, any pressure lower than this critical pressure level has no improved effect on the dielectric performance of the gap between contacts of a switch. As vacuum pressure begins to deteriorate, the breakdown voltage performance of the switch also deteriorates.

As such, vacuum condition is extremely important for electric devices comprising a switch in a vacuum environment, such as vacuum interrupters. This is especially important in switching of reactive loads, where a restrike may easily occur during current breaking in case the vacuum interrupter condition is deteriorated, and the restrike may cause a failure as well as its associated system components. However, due to the design and manufacturing technology of vacuum interrupters, and the physical nature of high vacuum, monitoring the vacuum level in vacuum interrupters is a challenging task with only limited methods having been used so far. Thus, an improved approach of monitoring vacuum level of an electric device is desired.

SUMMARY

Example embodiments of the present disclosure propose a solution for monitoring vacuum interrupter's condition of an electric device.

In a first aspect, it is provided a method for monitoring vacuum interrupter's condition of an electric device. The method comprises receiving a first voltage signal indicating a first voltage at a first contact of a switch inside the electric device. The first contact of the switch is coupled to a source line. The method further comprises receiving a second voltage signal indicating a second voltage at a second contact of the switch. The second contact of the switch is coupled to a reactive component. The method comprises receiving a current signal indicating a current at the second contact of the switch. The method comprises determining occurrence of a restrike in response to determining increasing amplitudes of the first voltage signal, the second voltage signal and the current signal in a time slot. The method further comprises determining the vacuum interrupter condition based on the determined occurrence of the restrike.

In a second aspect, it is provided an electric device. The electric device comprises one or more processors. The electric device further comprises a computer readable storage medium storing one or more programs, the one or more programs comprising instructions, which when executed by the one or more processors of the electric device, cause the electric device to carry out the method of the first aspect.

In a third aspect, it is provided a computer readable storage medium storing one or more programs. The one or more programs comprises instructions. The instructions when executed by the one or more processors of an electric device cause the electric device to carry out the method of the first aspect.

According to the embodiments of the present disclosure, the solution according to embodiments of the present disclosure may provide a reliable and cost-saving non-intrusive approach for measuring vacuum level of an electric device, especially the vacuum interrupter.

BRIEF DESCRIPTION OF THE DRAWINGS

Through the following detailed descriptions with reference to the accompanying drawings, the above and other objectives, features and advantages of the example embodiments disclosed herein will become more comprehensible. In the drawings, several example embodiments disclosed herein will be illustrated in an example and in a non-limiting manner, wherein.

Throughout the drawings, the same or corresponding reference symbols refer to the same or corresponding parts.

DETAILED DESCRIPTION

Figure 1:
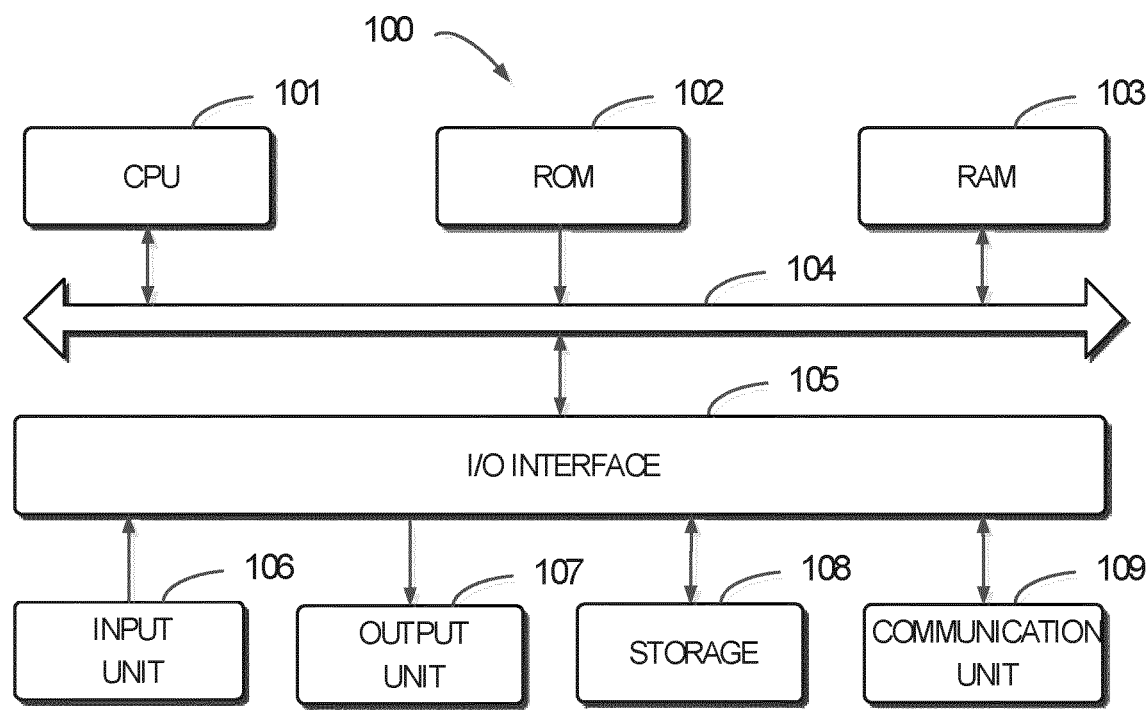
FIG. 1 illustrates an example device of implementing some example embodiments of the present disclosure.

The subject matter described herein will now be discussed with reference to several example embodiments. These embodiments are discussed only for the purpose of enabling those skilled persons in the art to better understand and thus implement the subject matter described herein, rather than suggesting any limitations on the scope of the subject matter.

The term "comprises" or "includes" and its variants are to be read as open terms that mean "includes, but is not limited to." The term "or" is to be read as "and/or" unless the context clearly indicates otherwise. The term "based on" is to be read as "based at least in part on." The term "being operable to" is to mean a function, an action, a motion or a state can be achieved by an operation induced by a user or an external mechanism. The term "one embodiment" and "an embodiment" are to be read as "at least one embodiment." The term "another embodiment" is to be read as "at least one other embodiment."

Unless specified or limited otherwise, the terms "mounted," "connected," "supported," and "coupled" and variations thereof are used broadly and encompass direct and indirect mountings, connections, supports, and couplings. Furthermore, "connected" and "coupled" are not restricted to physical or mechanical connections or couplings. In the description below; like reference numerals and labels are used to describe the same, similar or corresponding parts in the Figures. Other definitions, explicit and implicit, may be included below.

FIG. 1 illustrates a schematic diagram of an electronic device 100 for implementing embodiments of the present disclosure. As shown, the electronic device 100 includes a central process unit (CPU) 101 in an embodiment. In another embodiment, one or more processors apply as well.

The CPU 101 can perform various suitable acts and processing based on the computer program instructions stored in the read-only memory (ROM) 102 or the computer program instructions loaded into the random-access memory (RAM) 103 from the storage unit 108.

Various kinds of programs and data required by the operations of the device 100 can also be stored in the RAM 103. CPU 101, ROM 102 and RAM 103 are connected to each other via a bus 104. The input/output (I/O) interface 105 is also connected to the bus 104.

A plurality of components in the device 100 are connected to the I/O interface 105, including: an input unit 106, such as a keyboard, a mouse and the like: an output unit 107, such as various kinds of displays and loudspeakers and the like: a storage unit 108, such as a disk and an optical disk and the like; and a communication unit 109, such as a network card, a modem, a wireless communication transceiver and the like. The communication unit 109 allows the device 100 to exchange information/data with other devices via the computer network, such as the Internet, and/or various telecommunication networks.

Each procedure and processing described below; such as the method 400 of FIG. 4 as described below; can also be performed by the processing unit 101. For example, in some embodiments, the method 400 can be implemented as a computer software program tangibly included in the computer-readable medium, for example the storage unit 108. In some embodiments, the computer program can be partially or fully loaded and/or mounted to the device 100 via the ROM 102 and/or the communication unit 109. When the computer program is loaded to the RAM 103 and executed by the CPU 101, acts of the method 400, can be implemented.

Generally, various embodiments of the present disclosure can be implemented by hardware or dedicated circuit, software, logic, or any combinations thereof. Some aspects can be implemented by hardware while other aspects can be implemented by firmware or software, in which the firmware or the software can be executed by the controller, the microprocessor or other computing devices.

Although aspects of the present disclosure are illustrated and described as block diagram and flow chart or represented using some other graphs, it should be understood that the block, device, system, technology or method described herein can be implemented by hardware, software, firmware, dedicated circuit or logic, universal hardware, or controller or other computing devices, or any combinations thereof in a non-restrictive manner.

In an example, the storage unit 108 may store one or more programs configured to be executed by one or more processors, the one or more programs including instructions for performing the method 400, as described below.

As described above, condition of the vacuum interrupter is extremely important for electric devices comprising a switch in a vacuum environment, such as vacuum interrupters. To monitor vacuum level of the vacuum interrupters, conventional approaches comprises two general groups. The first group is off-line monitoring which requires removal of the switch from the system and disassembly to perform the check. Apparently, the first group may be inconvenient, and cannot timely determine deterioration of vacuum condition.

The second group is on-line monitoring which may be performed when the switch is installed in the system and under operation. The second group may be further divided into two subgroups. The first subgroup is an intrusive monitoring which requires modification of the vacuum interrupters allowing installation of the sensors into the vacuum interrupter structure. For example, the sensors of the first subgroup may comprise pressure sensor, PD detectors and so on. Intrusive monitoring may cause risk of deterioration of the vacuum condition, and it may be expensive.

The second subgroup is non-intrusive monitoring which uses external sensors to determine the inner pressure levels. The sensors of the second subgroup may comprise coupling capacitance sensors, electrical field sensors and so on. However, incorporation of external sensors may significantly increase cost, and may be inaccurate because the sensors are located outside of the vacuum interrupters and sense the vacuum condition indirectly. Thus, it is desired to develop a novel approach to monitor the vacuum condition of an electric device comprising a switch in a vacuum environment, such as the vacuum interrupters.

Figure 2:
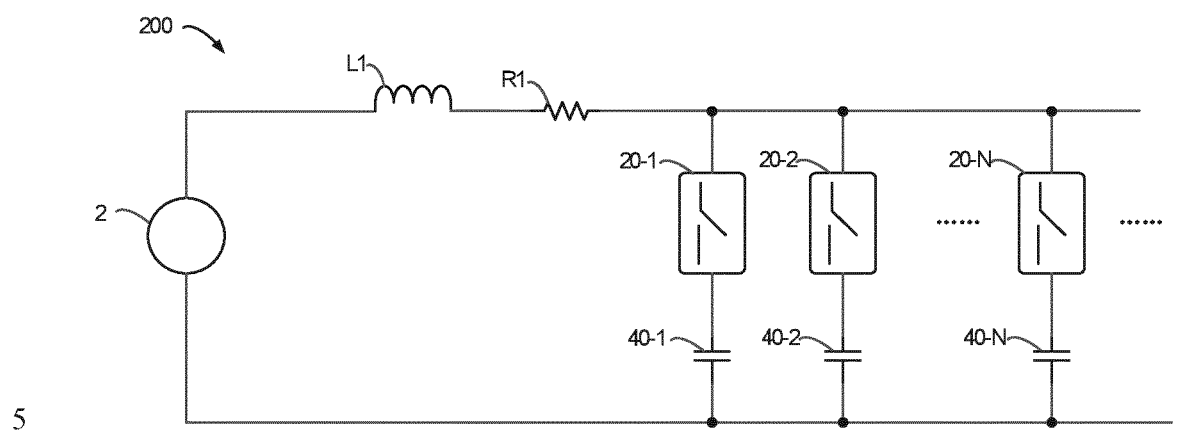
FIG. 2 illustrates an environment implementing an electric system in accordance with some example embodiments of the present disclosure.

FIG. 2 illustrates an environment implementing an electric system 200 in accordance with some example embodiments of the present disclosure. In an embodiment, the electric system 200 may comprise an AC source 2, a first inductor L1 and a first resistor R1. The electric system 200 may further comprise at least one electric device 20-1, 20-2 . . . , 20-N (collectively referred to as "electric device 20") and at least one reactive component 40-1, 40-2, . . . , 40-N (collectively referred to as "reactive component 40"), where N represents an integer greater than zero. Each of the at least one electric device 20-1, 20-2 . . . , 20-N is coupled in series with a corresponding one of the at least one reactive component 40-1, 40-2, . . . , 40-N between a source line and a ground line. In some embodiments, the reactive component may be a capacitor, an inductor and so on.

The AC source 2 provides AC current flowing through the first inductor L1 and the first resistor R1 to the electric device 20 and the reactive component 40. In some embodiments, the electric device 20 may be a vacuum interrupter. The electric device 20 may operate to switch on or switch off the electrical path based on a controlling signal. Although the electric device 20 is illustrated to be a vacuum interrupter, this is only for illustration without suggesting any limitations as to the scope of the subject matter described here. It is to be understood that the approach described herein may be applied to other electric devices comprising a switch in a vacuum environment.

Figure 3:
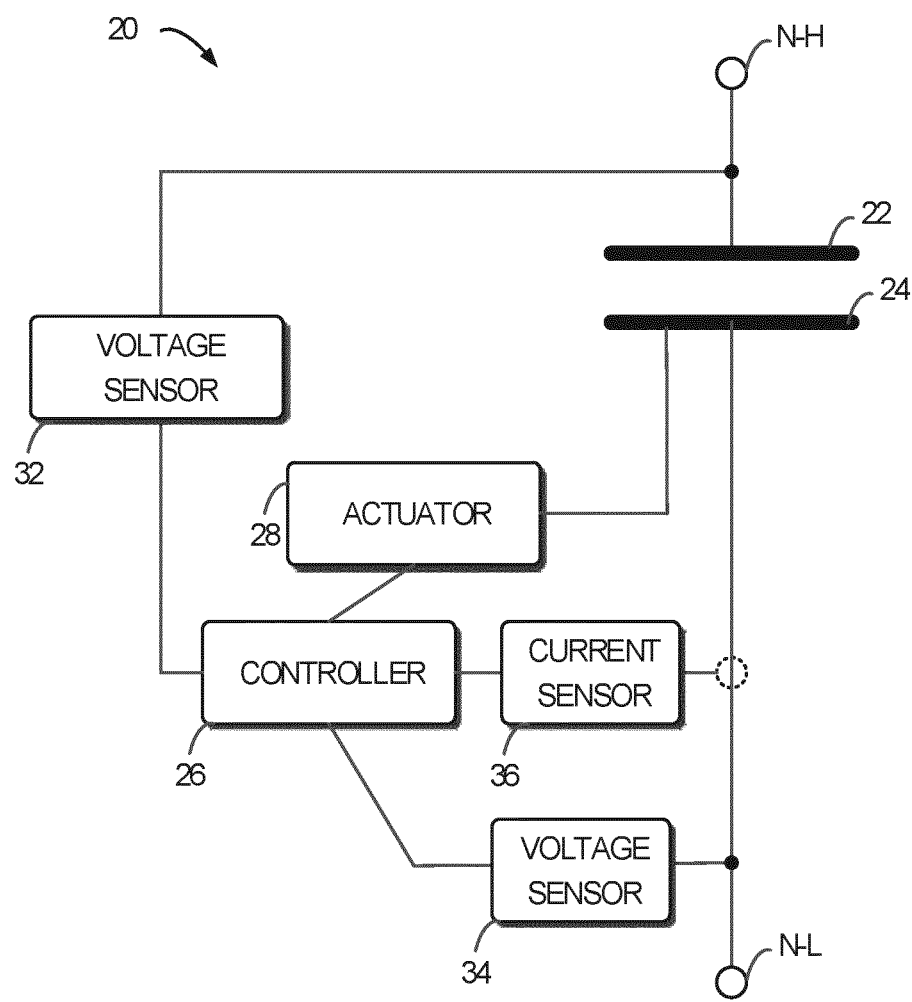
FIG. 3 is a block diagram illustrating a vacuum interrupter in accordance with some example embodiments of the present disclosure.

FIG. 3 is a block diagram illustrating an electric device 20 in accordance with some example embodiments of the present disclosure. It is to be understood that all the components shown in FIG. 3 are located and sealed inside the electric device 20 to maintain the vacuum level. The electric device 20 may comprises a switch comprising a first contact 22 and a second contact 24. In an embodiment, the first contact is a fixed contact coupled to a first node N-H, and the second contact is a movable contact coupled to a second nod N-L. In an embodiment, the first node N-H is coupled to a source line, and the second node N-L is coupled to a first terminal of the reactive component 40.

The electric device 20 may further comprise a controller 26 and an actuator 28. The actuator 28 receives a moving signal from the controller 26 to cause the movable contact 24 to move, such that the movable contact 24 may physically contact the fixed contact 22 to switch on the electrical path, or may physically depart from the fixed contact 22 to switch off the electrical path. The controller 26 may switch on or switch off the electrical path based on instructions received from a remote controlling center, such as a controlling center of a grid.

In case that the movable contact 24 moves away from the fixed contact 22, it may comprise three stages. The first stage is the starting stage where the movable contact 24 is still in close contact with the fixed contact 22. The second stage is the middle stage where the movable contact 24 has moved away from the fixed contact 22 by a small distance, as compared to the first stage. In the second stage, although the two contacts have been away from each other by a small distance, there is still a vacuum arc electrically connecting the movable contact 24 and the fixed contact 22. As such, the electrical path still exists.

The third stage is that movable contact 24 moves further from the fixed contact 22, and there is no vacuum arc existing. In this case, the movable contact 24 and the fixed contact 22 ideally are insulated from each other. However, in case that the vacuum condition deteriorates, the dielectric property between the movable contact 24 and the fixed contact 22 may deteriorate accordingly, based on the Paschen law: As such, a restrike may occur between the movable contact 24 and the fixed contact 22. The restrike is not desired, and may cause a serious failure of the electric device 20.

The electric device 20 may have a long time service life, for example several years, and may switch on/off once per day in some embodiments. In this case, it is important to continuously monitor the vacuum condition of the electric device without intrusion, so as to prevent from any breakdown caused by the restrike.

The inventors have found that certain voltage and/or current patterns occur when a restrike occurs. Specifically, the voltages of the contacts and/or current at the load side may exhibit a significantly increasing amplitude when the restrike occurs. For example, the voltage across the contacts may exceed 2.5 p.u., and a high frequency inrush current may be generated. In some cases, one or more consecutive restrikes will follow the first restrike, resulting in further voltage rise known as a voltage escalation.

The embodiments herein utilize these patterns to identify the restrikes. Once a restrike occurs or the number of the restrikes for a given number of switching exceeds a predetermined value, it can be determined that the vacuum condition has deteriorated and the vacuum interrupter may need replacement.

The electric device 20 further comprises a voltage sensor 32 to sense a first voltage at the first contact 22 of the switch inside the electric device 20. The first contact 22 is coupled to a source line. The electric device 20 further comprises a second voltage sensor 34 to sense a second voltage at a second contact 24 of the switch. The second contact 34 is coupled to the reactive component 40. The controller 26 is configured to receive a first voltage signal indicating the first voltage from the voltage sensor 32 and a second voltage signal indicating the second voltage from the voltage sensor 34.

The electric device 20 may further comprise a current sensor 36 to sense a current at the second contact 24 of the switch. The controller 26 is further configured to receive a current signal indicating the current. In an embodiment, all the three sensors and the controller 26 are located inside the electric device 20. In other embodiments, the controller 26 may be located outside the electric device 20, and can be implemented as the electronic device 100 of FIG. 1.

Although the voltage sensor 32, the voltage sensor 34 and the current sensor 36 are illustrated to be individual sensors, this is only for illustration without suggesting any limitations as to the scope of the subject matter described here. It is to be understood that a sensing unit integrating the three sensors applies as well.

The three sensors all are configured to continuously monitor the voltages and currents, and send the sensed results to controller 26 immediately or periodically. As described above, the switch may operate to switch once per day, in some embodiments. In case the switch begins to switch off, there are three stages.

In the first stage, the controller 26 controls the actuator 28 to actuate the movable contact 24, such that the movable contact 24 starts to move away from the fixed contact 22. In the second stage, the controller 26 controls the actuator 28 to cause the movable contact 24 to move away from the fixed contact a little bit more, with a vacuum arc therebetween forming the electrical path. In the third stage, the controller 26 controls the actuator 28 to cause the movable contact 24 to move away from the fixed contact further, such that an insulation is formed between the movable contact 24 and the fixed contact 22 in an ideal status.

In the third stage, the voltage sensor 32, the voltage sensor 34 and the current sensor 36 continuously sense the first voltage, the second voltage and the current, respectively. If a restrike occurs in the third stage, the voltage sensor 32, the voltage sensor 34 and the current sensor 36 may sense significant increasing amplitudes of the first voltage, the second voltage and the current in a time slot. The controller 26 may thus receive the first voltage signal indicating an increasing amplitude of the first voltage, the second voltage signal indicating an increasing amplitude of the second voltage and the current signal indicating an increasing amplitude of the current in the time slot.

In contrast, if no restrike occurs, the controller 26 may receive the first voltage signal indicating a normal amplitude of the first voltage, the second voltage signal indicating a normal amplitude of the second voltage and the current signal indicating a normal amplitude of the current in a time slot.

Thus, the controller 26 may determine occurrence of a restrike accordingly in response to determining increasing amplitudes of the first voltage signal, the second voltage signal and the current signal in the time slot. In an embodiment, the controller 26 may determine, based on the first voltage signal, that the first voltage exceeds a first predetermined voltage value. The controller 26 may further determine, based on the second voltage signal, that the second voltage exceeds a second predetermined voltage value. The controller 26 may further determine, based on the current signal, that the current exceeds a predetermined current value.

The first predetermined voltage value, the second predetermined voltage value, and the predetermined current value may be based on calculation or experiments, and may be selected as needed.

In some embodiments, the electric device 20 may have a strict standard for vacuum condition. In this case, once a restrike is determined, the electric device 20 may have an unacceptable vacuum condition, and the electric device 20 may thus need to be replaced. In some other embodiments, the electric device 20 may tolerate a certain degree of occurrence of restrikes, as long as the number of the restrikes or percentage of restrikes over switching operation is below a predetermined value.

It can be seen that the controller 26 may determine the vacuum interrupter condition including acceptable condition and unaccepted condition, based on the determined occurrence of the restrike. In an embodiment, the controller 26 may count switching operation of the switch in response to determining the restrike. The controller 26 may further calculate a number of the switching operation between the restrike and a subsequent determined restrike. The controller 26 may further determine an unacceptable vacuum interrupter condition in response to the number of the switching operation exceeding a predetermined number. For example, in case the number of the switching operation is below than 1200 between two restrikes, the vacuum interrupter may be determined to have an unacceptable condition based on a requirement for a Class C2 vacuum interrupter.

As such, the condition of the vacuum interrupter of the electric device 20 can be determined based on the sensing results in a non-intrusive manner. In addition, since the three sensors and the controller are already disposed in most vacuum electric devices such as vacuum interrupters, the embodiments herein may be achieved simply by upgrading the programs or instructions. Thus, the embodiments herein have good compatibility with most conventional vacuum electric devices such as vacuum interrupters, and require little cost in implementation.

In some embodiments, the controller 26 may be further configured to send an alert signal via a transceiver (not shown) coupled to the controller 26 to a remote center to indicate requirement of replacement for the electric device. In some other embodiments, the transceiver may be incorporated into the electronic device 100 of FIG. 1 to send the alert signal.

Figure 4:
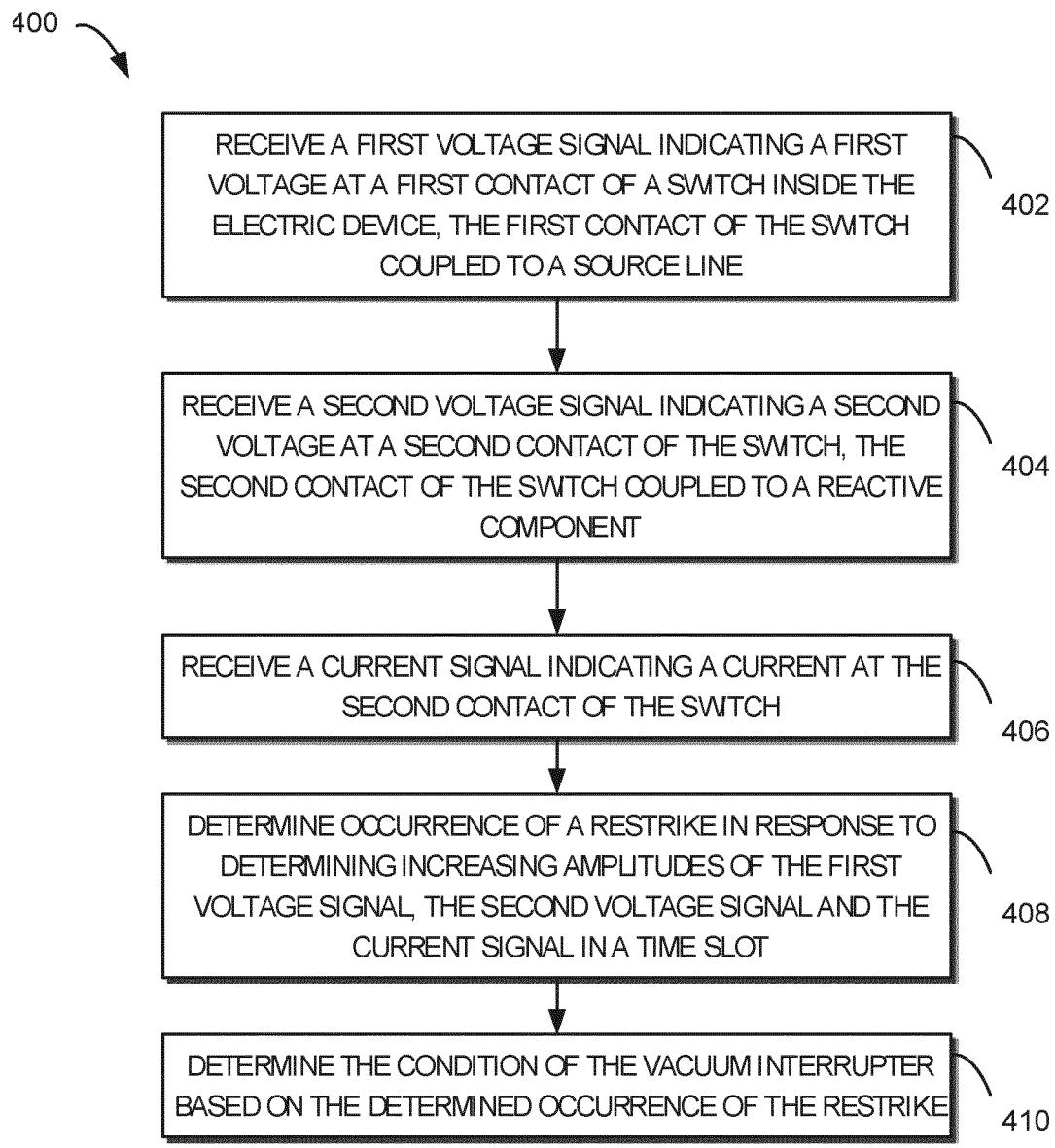
FIG. 4 illustrates a flowchart of a method for monitoring vacuum condition in accordance with some example embodiments of the present disclosure.

FIG. 4 illustrates a flowchart of a method 400 for monitoring the condition of the vacuum interrupter in accordance with some example embodiments of the present disclosure.

At 402, the controller 26 is configured to receive the first voltage signal indicating the first voltage at the first contact 22 of the switch inside the electric device. The first contact 22 of the switch is coupled to the source line. At 404, the controller 26 is further configured to receive the second voltage signal indicating the second voltage at the second contact 24 of the switch. The second contact 24 of the switch is coupled to a reactive component.

At 406, the controller 26 is configured to receive a current signal indicating a current at the second contact 24 of the switch. At 408, the controller 26 is configured to determine an occurrence of a restrike in response to determining increasing amplitudes of the first voltage signal, the second voltage signal and the current signal in a time slot. At 408, the controller 26 is configured to determine the vacuum interrupter condition based on the determined occurrence of the restrike.

Although only five blocks are illustrated in FIG. 4, the method 400 may comprise less or more blocks. It could be understood that the features described above with respect to FIGS. 1-3 can be applied to the method 400 of FIG. 4.

Hereinafter, some example implementations of the subject matter described herein will be listed.

Item 1: There is provided a method for monitoring a vacuum interrupter's condition of an electric device. The method comprises receiving a first voltage signal indicating a first voltage at a first contact of a switch inside the electric device, the first contact of the switch coupled to a source line. The method further comprises receiving a second voltage signal indicating a second voltage at a second contact of the switch, the second contact of the switch coupled to a reactive component. The method further comprises receiving a current signal indicating a current at the second contact of the switch. The method further comprises determining an occurrence of a restrike in response to determining increasing amplitudes of the first voltage signal, the second voltage signal and the current signal in a time slot. The method further comprises determining the condition of the vacuum interrupter based on the determined occurrence of the restrike.

Item 2: The method of Item 1, wherein determining the occurrence of the restrike comprises, in the time slot: determining, based on the first voltage signal, the first voltage exceeding a first predetermined voltage value: determining, based on the second voltage signal, the second voltage exceeding a second predetermined voltage value; and determining, based on the current signal, the current exceeding a predetermined current value.

Item 3: The method of any of Item 1 or 2, wherein determining the condition of the vacuum interrupter based on the determined occurrence of the restrike comprises: counting switching operation of the switch in a time period: counting the determined restrikes in the time period; computing a ratio of the counted number of the determined restrikes to the counted number of the switching operation; and determining an unacceptable vacuum condition in response to determining that the computed ratio exceeds a predetermined threshold.

Item 4: The method of any of Items 1-3, wherein determining the condition of the vacuum interrupter based on the determined occurrence of the restrike comprises: counting switching operation of the switch in response to determining the restrike: calculating a number of the switching operation between the restrike and a subsequent determined restrike; and determining an unacceptable vacuum interrupter condition in response to the number of the switching operation being below a predetermine number.

Item 5: The method of any of Items 1-4, wherein receiving the first voltage signal indicating the first voltage at the first contact of the switch comprises receiving the first voltage signal indicating the first voltage at a fixed contact of the switch: receiving the second voltage signal indicating the second voltage at the second contact of the switch comprises receiving the second voltage signal indicating the second voltage at a movable contact of the switch; and receiving the current signal indicating the current at the second contact of the switch comprises receiving the current signal indicating the current at the movable contact of the switch.

Item 6: The method of any of Items 1-5, further comprising: sending, prior to determining the occurrence of the restrike, an interruption signal to an actuator of the electric device to cause the movable contact to separate from the fixed contact.

Item 7: The method of any of Items 1-6, further comprising: in response to determining the unacceptable condition of the vacuum interrupter, sending an alert signal via a transceiver of an electronic device to a remote center to indicate a requirement of replacement for the electric device.

Item 8: The method of any of Items 1-7, wherein the reactive component comprises a capacitor.

Item 9: There is provided an electronic device. The electronic device comprises one or more processors: a computer readable storage medium storing one or more programs, the one or more programs comprising instructions, which when executed by the one or more processors of the electronic device, cause the electronic device to carry out the method of any of Items 1-8.

Item 10: There is provided a computer readable storage medium storing one or more programs. The one or more programs comprises instructions, which when executed by the one or more processors of an electronic device, cause the electronic device to carry out the method of any of Items 1-8.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. On the other hand, various features that are described in the context of a single embodiment may also be implemented in multiple embodiments separately or in any suitable subcombination.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for monitoring a condition of a vacuum interrupter of an electric device, comprising:
    receiving a first voltage signal indicating a first voltage between a source line and a first contact of a switch inside the electric device, the first contact of the switch coupled to the source line;
    receiving a second voltage signal indicating a second voltage between a second contact of the switch and a reactive component, the second contact of the switch coupled to the reactive component;
    receiving a current signal indicating a current at the second contact of the switch;
    determining an occurrence of a restrike in response to determining a simultaneous increase in amplitudes of the first voltage signal, the second voltage signal, and the current signal; and
    determining the condition of the vacuum interrupter based on the determined occurrence of the restrike, wherein determining the condition of the vacuum interrupter based on the determined occurrence of the restrike comprises either
        counting a number of switching operations, between open and closed, performed by the switch in a time period, counting a number of determined occurrences of the restrike in the time period, computing a ratio of the counted number of the determined occurrences of the restrike to the counted number of the switching operation, and determining an unacceptable vacuum condition in response to determining that the computed ratio exceeds a predetermined ratio value, or
        in response to determining the restrike, counting a number of switching operations, between open and closed, that are performed by the switch in a time period between the restrike and a subsequent determined restrike, and determining an unacceptable vacuum interrupter's condition in response to the number of the switching operations being below a predetermined number.

2. The method of claim 1, wherein determining the occurrence of the restrike comprises:
    determining, based on the first voltage signal, the first voltage exceeding a first predetermined voltage value;
    determining, based on the second voltage signal, the second voltage exceeding a second predetermined voltage value; and
    determining, based on the current signal, the current exceeding a predetermined current value.

3. The method of claim 1, wherein the first contact is a fixed contact, and wherein the second contact is a movable contact.

4. The method of claim 3, further comprising:
    sending, prior to determining the occurrence of the restrike, an interruption signal to an actuator of the electric device to cause the movable contact to separate from the fixed contact.

5. The method of claim 1, further comprising:
    in response to determining the unacceptable condition of the vacuum interrupter, sending an alert signal via a transceiver of an electronic device to a remote center to indicate a requirement of replacement for the electric device.

6. The method of claim 1, wherein the reactive component comprises a capacitor.

7. An electronic device comprising:
    one or more processors; and
    a computer readable storage medium storing one or more programs, the one or more programs comprising instructions, which when executed by the one or more processors of the electronic device, cause the electronic device to
        receive a first voltage signal indicating a first voltage between a source line and a first contact of a switch inside an electric device, the first contact of the switch coupled to the source line,
        receive a second voltage signal indicating a second voltage between a second contact of the switch and a reactive component, the second contact of the switch coupled to the reactive component,
        receive a current signal indicating a current at the second contact of the switch,
        determine an occurrence of a restrike in response to determining a simultaneous increase in amplitudes of the first voltage signal, the second voltage signal, and the current signal, and
        determine a condition of a vacuum interrupter based on the determined occurrence of the restrike, wherein determining the condition of the vacuum interrupter based on the determined occurrence of the restrike comprises either
            counting a number of switching operations, between open and closed, performed by the switch in a time period, counting a number of determined occurrences of the restrike in the time period, computing a ratio of the counted number of the determined occurrences of the restrike to the counted number of the switching operation, and determining an unacceptable vacuum condition in response to determining that the computed ratio exceeds a predetermined ratio value, or in response to determining the restrike, counting a number of switching operations, between open and closed, that are performed by the switch in a time period between the restrike and a subsequent determined restrike, and determining an unacceptable vacuum interrupter's condition in response to the number of the switching operations being below a predetermined number.

8. The electronic device of claim 7, wherein determining the occurrence of the restrike comprises:

determining, based on the first voltage signal, the first voltage exceeding a first predetermined voltage value;

determining, based on the second voltage signal, the second voltage exceeding a second predetermined voltage value; and determining, based on the current signal, the current exceeding a predetermined current value.

9. The electronic device of claim 7, wherein the electronic device further comprises a transceiver, and wherein the instructions further cause the electronic device to:

in response to determining the unacceptable condition of the vacuum interrupter, send an alert signal via the transceiver to a remote center to indicate a requirement of replacement for the electric device.

10. The electronic device of claim 7, wherein the first contact is a fixed contact, and wherein the second contact is a movable contact.

11. The electronic device of claim 10, wherein the instructions further cause the electronic device to:

send, prior to determining the occurrence of the restrike, an interruption signal to an actuator of the electric device to cause the movable contact to separate from the fixed contact.

12. The electronic device of claim 7, wherein the reactive component comprises a capacitor.

13. A non-transitory computer readable storage medium storing one or more programs, the one or more programs comprising instructions, which when executed by the one or more processors of an electronic device, cause the electronic device to:

receive a first voltage signal indicating a first voltage between a source line and a first contact of a switch inside an electric device, the first contact of the switch coupled to the source line;

receive a second voltage signal indicating a second voltage between a second contact of the switch and a reactive component, the second contact of the switch coupled to the reactive component;

receive a current signal indicating a current at the second contact of the switch;

determine an occurrence of a restrike in response to determining a simultaneous increase in amplitudes of the first voltage signal, the second voltage signal, and the current signal; and determine a condition of a vacuum interrupter based on the determined occurrence of the restrike, wherein determining the condition of the vacuum interrupter based on the determined occurrence of the restrike comprises either counting a number of switching operations, between open and closed, performed by the switch in a time period, counting a number of determined occurrences of the restrike in the time period, computing a ratio of the counted number of the determined occurrences of the restrike to the counted number of the switching operation, and determining an unacceptable vacuum condition in response to determining that the computed ratio exceeds a predetermined ratio value, or in response to determining the restrike, counting a number of switching operations, between open and closed, that are performed by the switch in a time period between the restrike and a subsequent determined restrike, and determining an unacceptable vacuum interrupter's condition in response to the number of the switching operations being below a predetermined number.

14. The non-transitory computer readable storage medium of claim 13, wherein determining the occurrence of the restrike comprises:

determining, based on the first voltage signal, the first voltage exceeding a first predetermined voltage value;

determining, based on the second voltage signal, the second voltage exceeding a second predetermined voltage value; and determining, based on the current signal, the current exceeding a predetermined current value.

* * * * *